(12) United States Patent
Kubota

(10) Patent No.: US 9,776,199 B2
(45) Date of Patent: Oct. 3, 2017

(54) COATING APPARATUS, COATING METHOD AND STORAGE MEDIUM

(71) Applicant: TOKYO ELECTRON LIMITED, Tokyo (JP)

(72) Inventor: Minoru Kubota, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 44 days.

(21) Appl. No.: 14/658,461

(22) Filed: Mar. 16, 2015

(65) Prior Publication Data

US 2015/0258570 A1    Sep. 17, 2015

(30) Foreign Application Priority Data

Mar. 17, 2014    (JP) .................................. 2014-053972

(51) Int. Cl.
| | |
|---|---|
| *B05D 3/12* | (2006.01) |
| *B05B 12/02* | (2006.01) |
| *B05D 1/00* | (2006.01) |
| *H01L 21/67* | (2006.01) |
| *G06F 19/00* | (2011.01) |
| *H01L 21/00* | (2006.01) |
| *B05B 13/02* | (2006.01) |
| *B05B 13/04* | (2006.01) |

(52) U.S. Cl.
CPC .......... *B05B 12/02* (2013.01); *B05B 13/0242* (2013.01); *B05B 13/041* (2013.01); *B05D 1/005* (2013.01); *G06F 19/00* (2013.01); *H01L 21/00* (2013.01); *H01L 21/6715* (2013.01)

(58) Field of Classification Search
CPC ..... B05D 1/005; H01L 21/6715; G06F 19/00; B05B 12/02
USPC .................................................. 427/240, 425
See application file for complete search history.

(56) References Cited

U.S. PATENT DOCUMENTS

| | | | |
|---|---|---|---|
| 8,088,438 B2 * | 1/2012 | Ito ........................... | B05C 11/08 118/320 |
| 2001/0029111 A1 * | 10/2001 | You ........................ | B05D 1/005 438/782 |
| 2002/0150679 A1 * | 10/2002 | Minami ................. | B05D 1/005 427/240 |

(Continued)

FOREIGN PATENT DOCUMENTS

| | | |
|---|---|---|
| JP | 07-080387 A | 3/1995 |
| JP | 2001-239199 A | 9/2001 |
| JP | 2006-352144 A | 12/2006 |

*Primary Examiner* — Kirsten Jolley
(74) *Attorney, Agent, or Firm* — Nath, Goldberg & Meyer; Jerald L. Meyer

(57) ABSTRACT

A coating apparatus includes: a rotation holding unit configured to hold and rotate a substrate; a coating liquid supply unit configured to supply a coating liquid onto a surface of the substrate; and a control unit configured to control the rotation holding unit and the coating liquid supply unit. The control unit performs: controlling the coating liquid supply unit to supply the coating liquid onto an encircling line surrounding a rotational center of the substrate while controlling the rotation holding unit to rotate the substrate; followed by controlling the coating liquid supply unit to supply the coating liquid onto a central area; and followed by controlling the rotation holding unit to rotate the substrate at an angular velocity greater than that when the coating liquid is supplied onto the encircling line.

5 Claims, 11 Drawing Sheets

(56) References Cited

U.S. PATENT DOCUMENTS

| | | | |
|---|---|---|---|
| 2012/0122038 A1* | 5/2012 | Harumoto | G03F 7/2041 430/405 |
| 2015/0348779 A1* | 12/2015 | Wang | B05B 1/185 438/782 |

* cited by examiner

US 9,776,199 B2

COATING APPARATUS, COATING METHOD AND STORAGE MEDIUM

CROSS-REFERENCE TO RELATED APPLICATION

This application claims the benefit of Japanese Patent Application No. 2014-053972, filed on Mar. 17, 2014, in the Japan Patent Office, the disclosure of which is incorporated herein in its entirety by reference.

TECHNICAL FIELD

The present disclosure relates to a coating apparatus, a coating method and a non-transitory computer-readable storage medium.

BACKGROUND

A spin coating method is widely used as a method of coating a substrate such as a semiconductor wafer with a coating liquid. Such a spin coating method widely spreads the coating liquid supplied on the substrate by rotating the substrate. In addition, there is known a method for improving uniformity of film thickness as compared with the spin coating method. This method includes moving a nozzle and a substrate relative to each other by a predetermined pitch while supplying a coating liquid onto a substrate through the nozzle, thereby supplying the coating liquid to the entire area of a film formation region.

However, such a method has a tendency to require a long period of time until a coating process is completed as compared with the spin coating method.

SUMMARY

Some embodiments of the present disclosure include a coating apparatus, a coating method and a storage medium, which are capable of improving uniformity of film thickness while performing a coating process in a short period of time.

According to one embodiment of the present disclosure, there is provided a coating apparatus includes: a rotation holding unit configured to hold and rotate a substrate; a coating liquid supply unit configured to supply a coating liquid onto a surface of the substrate held by the rotation holding unit; and a control unit configured to control the rotation holding unit and the coating liquid supply unit, wherein the control unit performs: controlling the coating liquid supply unit to supply the coating liquid onto an encircling line surrounding a rotational center of the substrate while controlling the rotation holding unit to rotate the substrate; followed by controlling the coating liquid supply unit to supply the coating liquid onto a central area, which is positioned inside the encircling line and includes the rotational center of the substrate; and followed by controlling the rotation holding unit to rotate the substrate at an angular velocity greater than that when the coating liquid is supplied onto the encircling line such that the coating liquid on the encircling line and the central area widely spreads toward a periphery of the substrate.

According to another embodiment of the present disclosure, there is provided a coating method for use in a coating apparatus, which includes: supplying a coating liquid onto an encircling line surrounding a rotational center of a substrate while rotating the substrate; supplying the coating liquid onto a central area, which is positioned inside the encircling line and includes the rotational center of the substrate; and rotating the substrate at an angular velocity greater than that when supplying the coating liquid onto the encircling line such that the coating liquid on the encircling line and the central area widely spreads toward a periphery of the substrate.

According to another embodiment of the present disclosure, there is provided a non-transitory computer-readable storage medium storing a program operating on a computer stored thereon, wherein the program, when executed, causes the computer to perform the aforementioned coating method using a coating apparatus.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
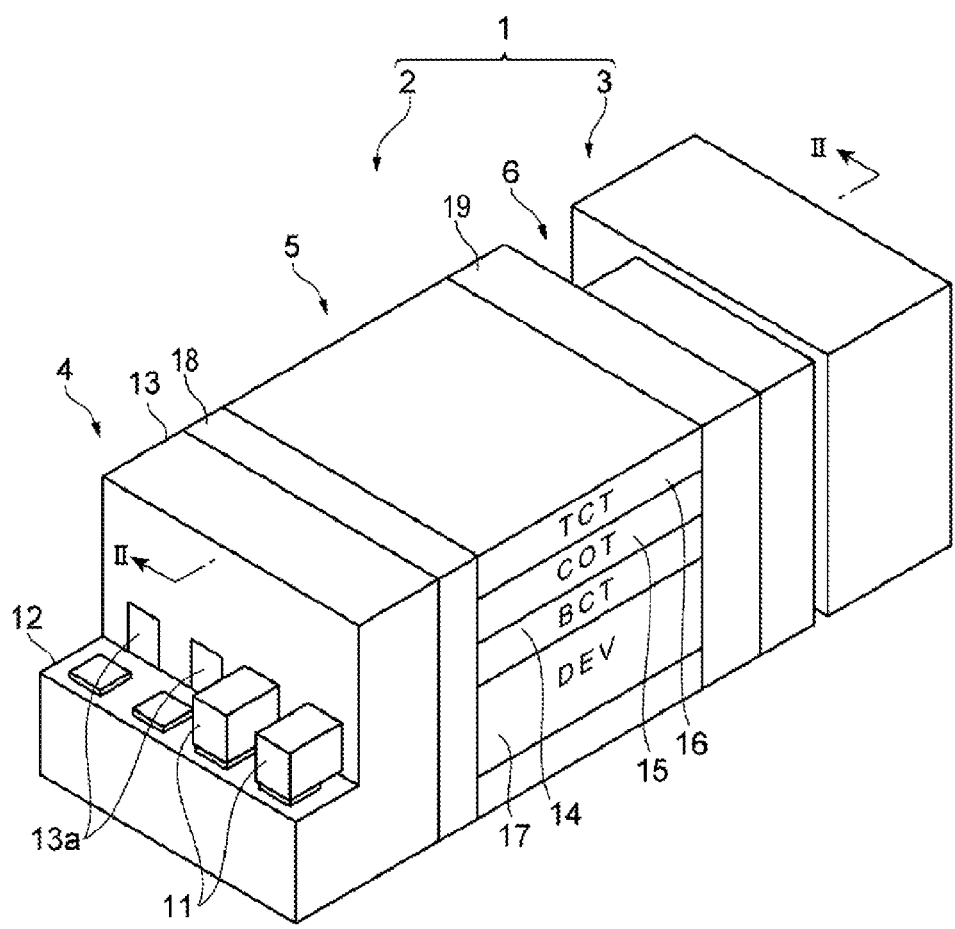
FIG. 1 is a perspective view of a substrate processing system.

Reference will now be made in detail to various embodiments, examples of which are illustrated in the accompanying drawings. In the following detailed description, like parts will be assigned like reference numerals, and redundant description will be omitted. In addition, numerous specific details are set forth in order to provide a thorough understanding of the present disclosure. However, it will be apparent to one of ordinary skill in the art that the present disclosure may be practiced without these specific details. In other instances, well-known methods, sequences, systems, and components have not been described in detail so as not to unnecessarily obscure aspects of the various embodiments.

<Substrate Processing System>

A substrate processing system 1 includes a coating/developing apparatus 2 and an exposure apparatus 3. The exposure apparatus 3 performs an exposure process on a resist film (photosensitive film). Specifically, the exposure apparatus 3 irradiates energy lines to a portion to be exposed in the resist film using a method such as a liquid immersion lithography. Examples of the energy line may include an ArF excimer laser, a KrF excimer laser, g-line, i-line or EUV (Extreme Ultraviolet).

Figure 2:
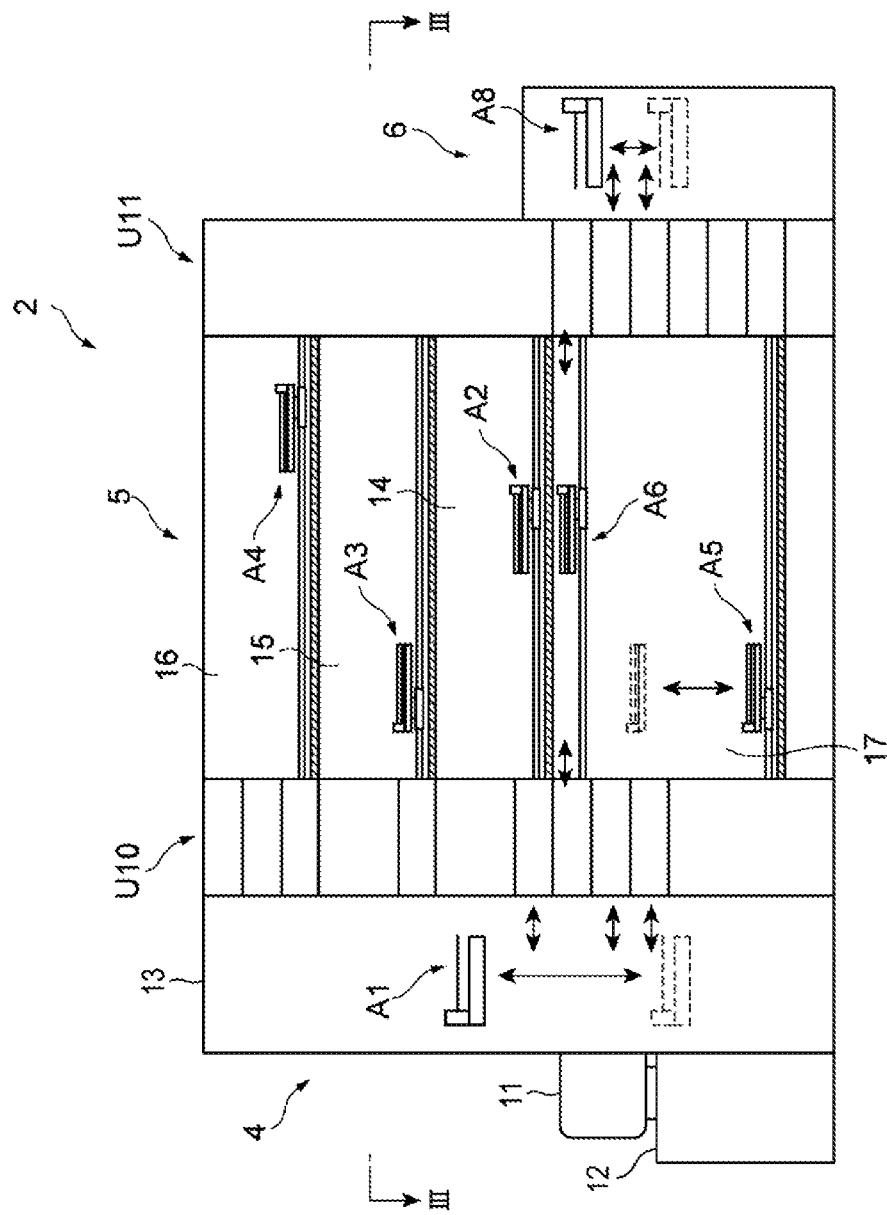
FIG. 2 is a sectional view taken along line II-II in FIG. 1.

The coating/developing apparatus 2 performs a process of forming a resist film on a surface of a wafer W (substrate) before the exposure process by the exposure apparatus 3, and developing the resist film after the exposure process. As shown in FIGS. 1 and 2, the coating/developing apparatus 2 includes a carrier block 4, a processing block 5 and an interface block 6, which are arranged in a horizontal direction.

The carrier block 4 includes a carrier station 12 and a loading/unloading section 13. The loading/unloading section 13 is arranged between the carrier station 12 and the processing block 5. The carrier station 12 supports a plurality of carriers 11. The carrier 11 accommodates plural sheets of wafers W therein while keeping a sealed state. The carrier 11 has a lateral side 11a (see FIG. 3) provided with an opening/closing door (not shown) through which the wafer W is transferred. The carrier 11 is detachably mounted on the carrier station 12 with the lateral side 11a facing the loading/unloading section 13. The loading/unloading section 13 includes a plurality of opening/closing doors 13a respectively corresponding to the plurality of carriers 11 mounted on the carrier station 12. The opening/closing doors installed in the lateral side 11a and the opening/closing doors 13a are simultaneously opened such that the carrier 11 and the loading/unloading section 13 communicate with each other. The loading/unloading section 13 includes a delivery arm A1 housed therein. The delivery arm A1 transfers the wafer W between the carrier 11 and the processing block 5.

The processing block 5 includes an under-layer film forming (BCT) module 14, a resist film forming (COT) module 15, an over-layer film forming (TCT) module 16, a development processing (DEV) module 17, and a first shelf section 18. The DEV module 17, the BCT module 14, the COT module 15 and the TCT module 16 are stacked in this order from the bottom.

The BCT module 14 includes a plurality of coating units (not shown), a plurality of heat treatment units (not shown), and a transfer arm A2 for transferring the wafer W between the units, which are housed therein. The BCT module 14 forms an under-layer film on a surface of the wafer W. The coating unit coats the surface of the wafer W with a coating liquid for forming the under-layer film. The heat treatment unit performs a heat treatment by heating the wafer W using, for example, a heat plate, followed by cooling the heated wafer W using, for example, a cooling plate. Examples of the heat treatment performed in the BCT module 14 may include a heating process to harden the coating liquid.

Figure 3:
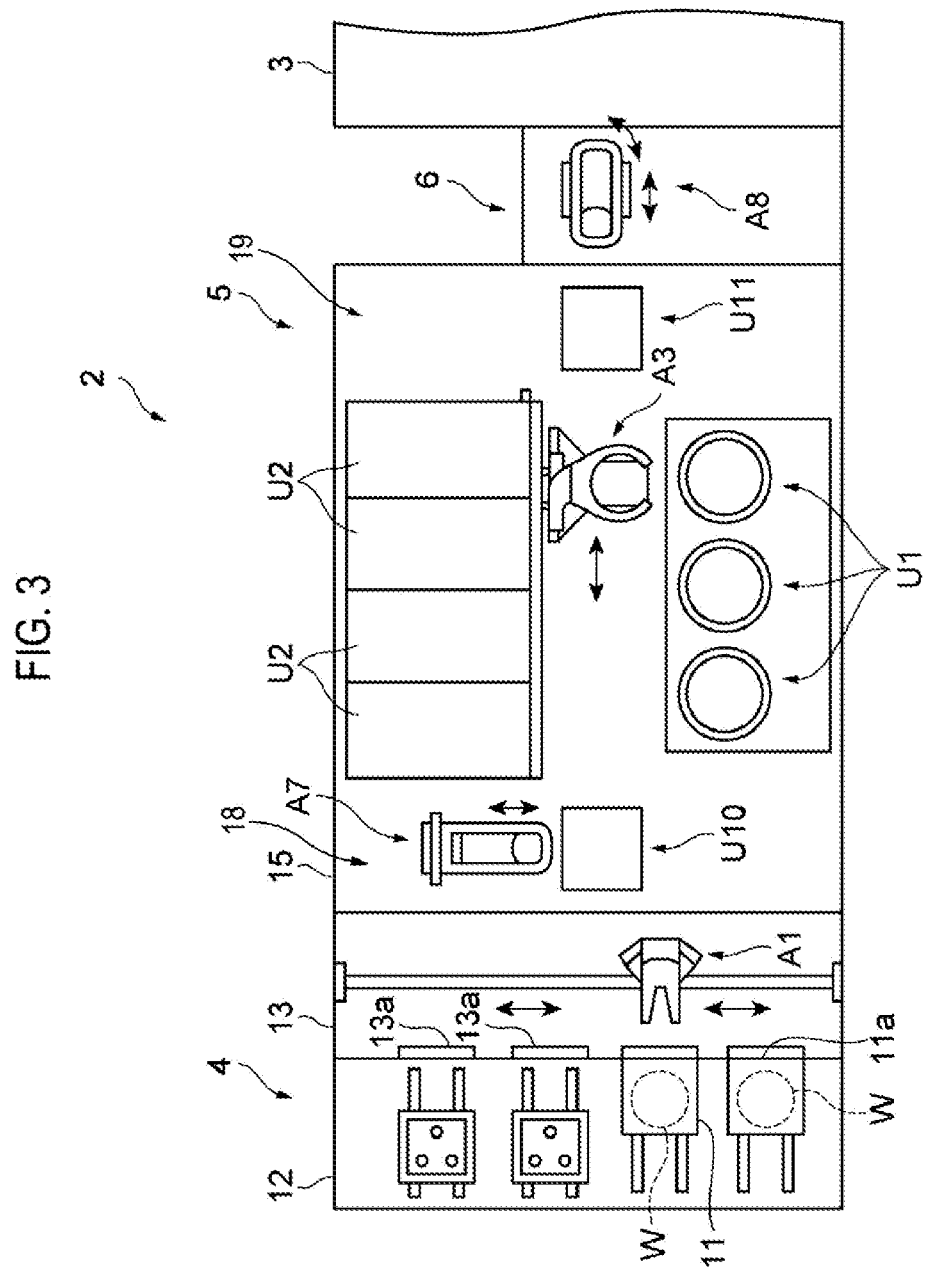
FIG. 3 is a sectional view taken along line III-III in FIG. 2.

As shown in FIG. 3, the COT module 15 includes a plurality of coating units U1, a plurality of heat treatment units U2 and a transfer arm A3 for transferring the wafer W between the units, which are housed therein. The COT module 15 forms a resist film on the under-layer film. The coating unit U1 coats the under-layer film with a coating liquid (resist agent) to form a resist film. The heat treatment unit U2 performs a heat treatment by heating the wafer W using, for example, a heat plate, followed by cooling the heated wafer W using, for example, a cooling plate. Examples of the heat treatment performed in the COT module 15 may include a heating process (PAB: Pre Applied Bake) to harden the coating liquid.

The TCT module 16 includes a plurality of coating units (not shown), a plurality of heat treatment units (not shown), and a transfer arm A4 for transferring the wafer W between the units, which are housed therein. The TCT module 16 forms an over-layer film on the resist film. The coating unit coats the surface of the wafer W with a coating liquid to form an over-layer film. The heat treatment unit performs a heat treatment by heating the wafer W using, for example, a heat plate, followed by cooling the heated wafer W using, for example, a cooling plate. Examples of the heat treatment performed in the TCT module 16 may include a heating process to harden the coating liquid.

As shown in FIG. 2, the DEV module 17 includes a plurality of developing units (not shown), a plurality of heat treatment units (not shown), a transfer arm A5 for transferring the wafer W between the units, and a direct transfer arm A6 for transferring the wafer without passing through the units, which are housed therein. The developing unit performs a developing process on an exposed portion of the resist film. The heat treatment unit performs a heat treatment by heating the wafer W using, for example, a heat plate, followed by cooling the heated wafer W using, for example, a cooling plate. Examples of the heat treatment performed in the DEV module 17 may include a heating process before the developing process (i.e., Post Exposure Bake (PEB)), a heating process after the developing process (i.e., Post Bake (PB)), or the like.

The first shelf section 18 is provided in a position adjacent to the carrier block 4 in the processing block 5. The first shelf section 18 includes a shelf unit U10 and a lifting arm A7. The shelf unit U10 is provided to extend from below the DEV module 17 up to the TCT module 16. Further, the shelf unit U10 is divided into a plurality of cells arranged in the vertical direction. The lifting arm A7 is provided in the vicinity of the shelf unit U10. The lifting arm A7 moves the wafer W up and down between the cells of the shelf unit U10.

The processing block 5 further includes a second shelf section 19 which is provided with a shelf unit U11. The shelf unit U11 is provided in a position adjacent to the interface block 6 in the processing block 5. The shelf unit U11 is provided to extend from below the DEV module 17 up to the DEV module 17. Further, the shelf unit U11 is divided into a plurality of cells arranged in the vertical direction.

The interface block 6, which is connected to the exposure apparatus 3, includes a delivery arm A8 housed therein. The delivery arm A8 transfers the wafer W between the shelf unit U11 and the exposure apparatus 3.

The coating/developing apparatus 2 operates as follows. First, the coating/developing apparatus 2 forms the under-layer film, the resist film and the over-layer film on the surface of the wafer W. Specifically, the delivery arm A1 picks up the wafer W from the carrier 11 and transfers the same to the lifting arm A7 of the first shelf section 18. The lifting arm A7 loads the wafer W into a respective cell for the BCT module 14 in the shelf unit U10. Then, the transfer arm A2 in the BCT module 14 picks up the wafer W and transfers the same to a respective unit of the BCT module 14. The coating unit coats the surface of the wafer W with a coating liquid for forming the under-layer film. The heat treatment unit performs a heat treatment for hardening the coating liquid.

Upon the formation of the under-layer film, the transfer arm A2 returns the wafer W to the lifting arm A7 of the first shelf section 18. The lifting arm A7 loads the wafer W into a respective cell for the COT module 15 in the shelf unit U10. Then, the transfer arm A3 in the COT module 15 picks up the wafer W and transfers the same to a respective unit of the COT module 15. The coating unit U1 coats the surface Wa of the wafer W with a coating liquid for forming the resist film. The heat treatment unit U2 performs a heat treatment (PAB) for curing the coating liquid.

Upon the formation of the resist film, the transfer arm A3 returns the wafer W to the lifting arm A7 of the first shelf section 18. The lifting arm A7 loads the wafer W in a respective cell for the TCT module 16 in the shelf unit U10. Then, the transfer arm A4 in the TCT module 16 picks up the wafer W and transfers the same to a respective unit of the TCT module 16. The coating unit coats the surface Wa of the wafer W with a coating liquid for forming the over-layer film. The heat treatment unit performs a heat treatment for hardening the coating liquid. Upon the formation of the over-layer film, the transfer arm A4 returns the wafer W to the lifting arm A7 of the first shelf section 18.

Subsequently, the coating/developing apparatus 2 sends the wafer W to the exposure apparatus 3. Specifically, the lifting arm A7 loads the wafer W which is returned thereto by the transfer arm A4, into a respective cell for the DEV module 17 in the shelf unit U10. In the DEV module 17, the direct transfer arm A6 picks up the wafer W and transfers the same to the shelf unit U11. The delivery arm A8 in the interface block 6 picks up the wafer W and deliveries the same to the exposure apparatus 3. Upon the completion of the exposure process by the exposure apparatus 3, the coating/developing apparatus 2 receives the wafer W from the exposure apparatus 3. That is, the delivery arm A8 receives the wafer W from the exposure apparatus 3 and transfers the same to the shelf unit U11.

Subsequently, the coating/developing apparatus 2 performs the developing process on the resist film. Specifically, the transfer arm A5 picks up the wafer W loaded into the shelf unit U11 and transfers the same to the heat treatment unit of the DEV module 17. The heat treatment unit performs the heat treatment (PEB) on the wafer W. Upon the completion of the PEB, the transfer arm A5 transfers the wafer W to the developing unit. The developing unit supplies a developing solution and a rinsing solution onto the surface of the wafer W, thereby performing the developing process on the resist film. Upon the completion of the developing process, the transfer arm A5 again transfers the wafer W to the heat treatment unit. The heat treatment unit performs the heat treatment (PB) on the wafer W.

Upon the completion of the PB, the transfer arm A5 transfers the wafer W to the lifting arm A7 of the first shelf section 18. The lifting arm A7 loads the wafer W into a delivery cell of the shelf unit U10. In the loading/unloading section 13, the delivery arm A1 returns the wafer W into the carrier 11. In this way, a series of processes from the film formation to the development are completed.

<Coating Unit>

Figure 4:
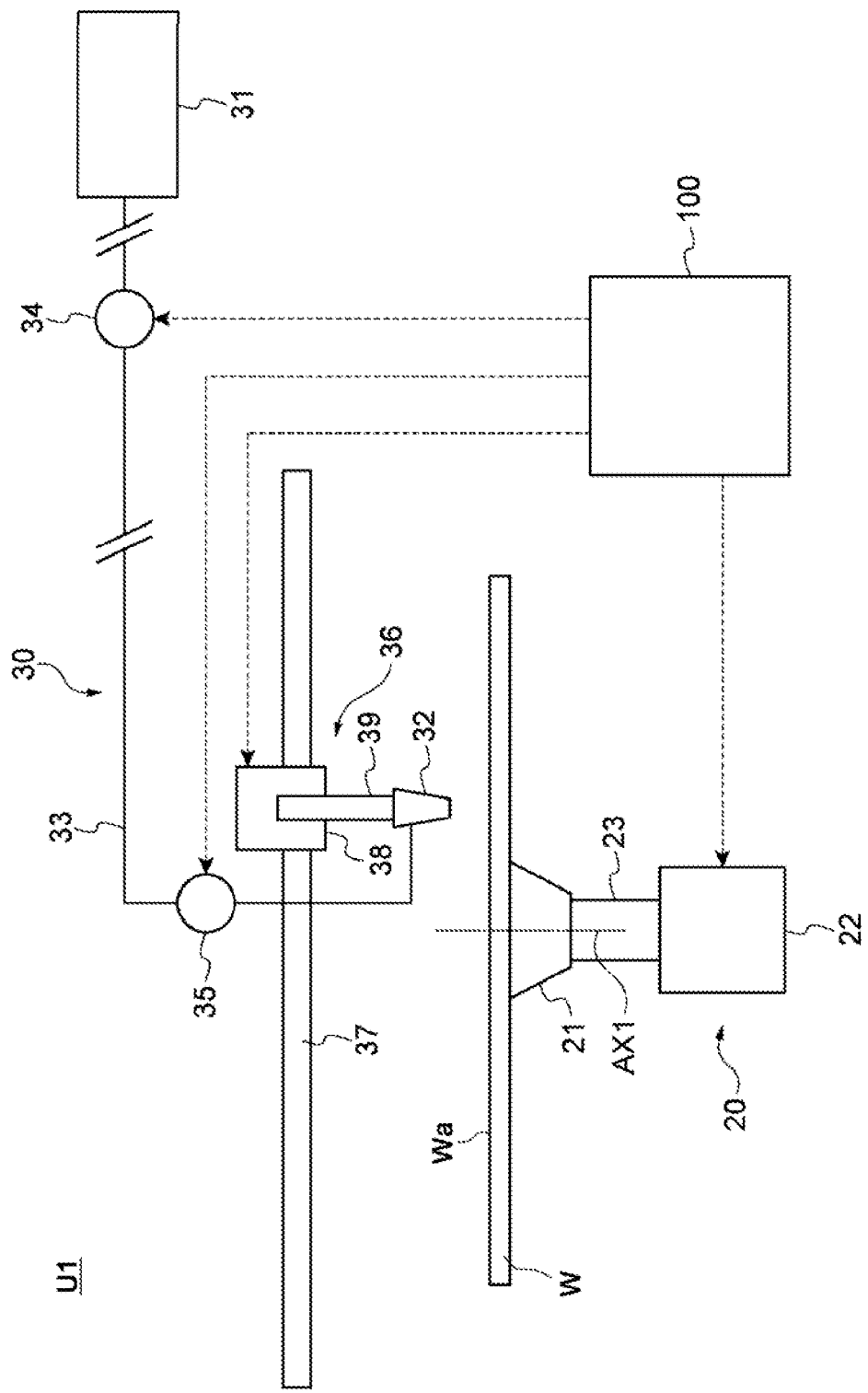
FIG. 4 is a schematic view of a coating unit.

Hereinafter, the coating unit U1 (coating device) will be described in detail. As shown in FIG. 4, the coating unit U1 includes a rotation holding unit 20 configured to hold and rotate the wafer W, a coating liquid supply unit 30 configured to supply a resist agent onto a surface Wa of the wafer W held by the rotation holding unit 20, and a control unit 100 configured to control the rotation holding unit 20 and the coating liquid supply unit 30.

The rotation holding unit 20 includes a holding part 21 and a rotation part 22. The rotation part 22, which is provided with a rotating shaft 23 structured to protrude upward, rotates the rotating shaft 23 using a power source (e.g., an electric motor). The holding part 21 is installed in a leading end of the rotating shaft 23. For example, the holding part 21 adsorptively holds the wafer W horizontally mounted thereon from the bottom.

The coating liquid supply unit 30 includes a coating liquid tank 31, a nozzle 32, a pump 34, a valve 35, and a nozzle moving unit 36. The coating liquid tank 31 stores a resist agent therein. The nozzle 32 is disposed above the wafer W held by the holding part 21. The nozzle 32 injects the resist agent supplied from the coating liquid tank 31 downward such that the resist agent is applied onto the surface Wa of the wafer W. The nozzle 32 is coupled to the coating liquid tank 31 through a supply pipe 33. The pump 34 is installed in the middle of the supply pipe 33 and is configured to forcibly feed the resist agent from the coating liquid tank 31 to the nozzle 32. The valve 35 is installed between the nozzle 32 and the pump 34 in the supply pipe 33. The valve 35 functions to control the start or stop of the injection of the resist agent from or to the nozzle 32.

The nozzle moving unit 36 includes a horizontal guide rail 37 and a slide block 38 movable along the guide rail 37. The slide block 38 is coupled to the nozzle 32 through an arm 39. The nozzle moving unit 36 moves the slide block 38 using a power source (e.g., an electric motor) such that the nozzle 32 moves together with the movement of the slide block 38. As viewed from the top, the movement path of the nozzle 32 passes through a rotational center AX1 of the wafer W.

The control unit 100 includes one or a plurality of control computers. The control unit 100 includes a display part (not shown) for displaying a setting screen of control conditions thereon, an input part (not shown) for inputting the control conditions, and a reading part (not shown) for reading a program from a computer-readable storage medium. The storage medium stores a program for causing the coating unit U1 to perform a coating process. The program is read by the reading part of the control unit 100. Examples of the storage medium may include a hard disc, a compact disc, a flash memory, a flexible disc, a memory card, and the like. The control unit 100 controls the rotation holding unit 20 and the coating liquid supply unit 30 according to the control conditions input by the input part and the program read by the reading part.

Figure 5:
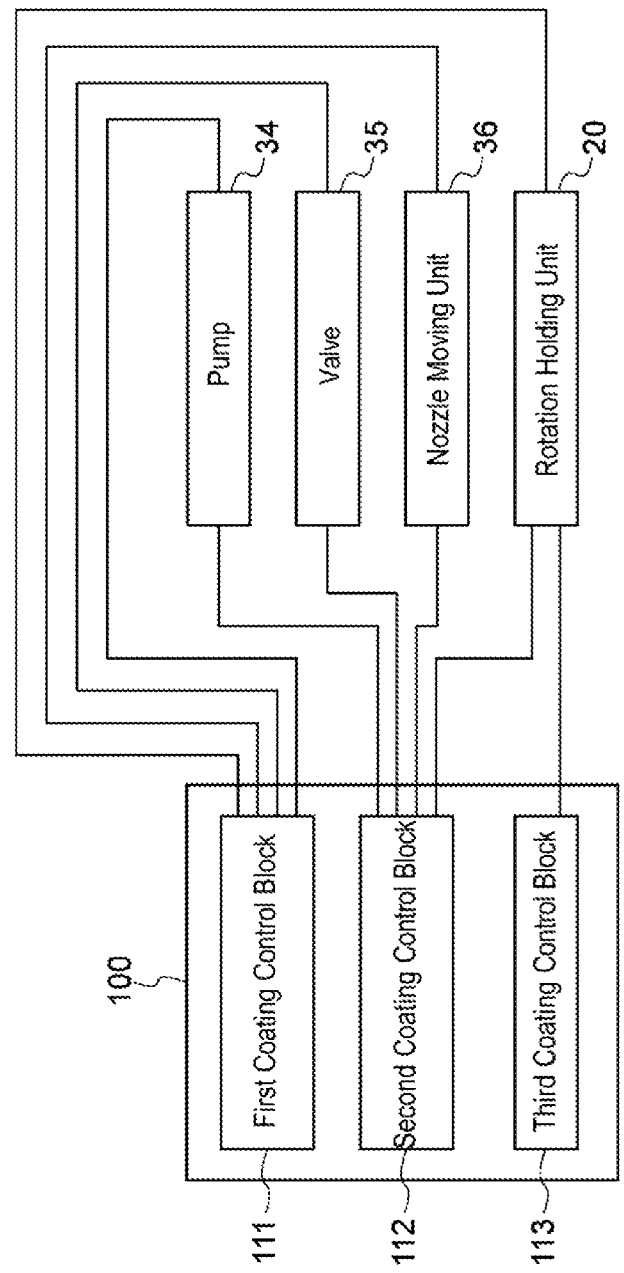
FIG. 5 is a block diagram showing a functional configuration of a control unit.

FIG. 5 is a block diagram showing respective functions realized by the control unit 100 with the execution of the program, as virtual components (hereinafter, referred to as "functional blocks"). As shown in FIG. 5, the control unit 100 includes, as the functional blocks, a first coating control block 111, a second coating control block 112 and a third coating control block 113.

Figure 9:
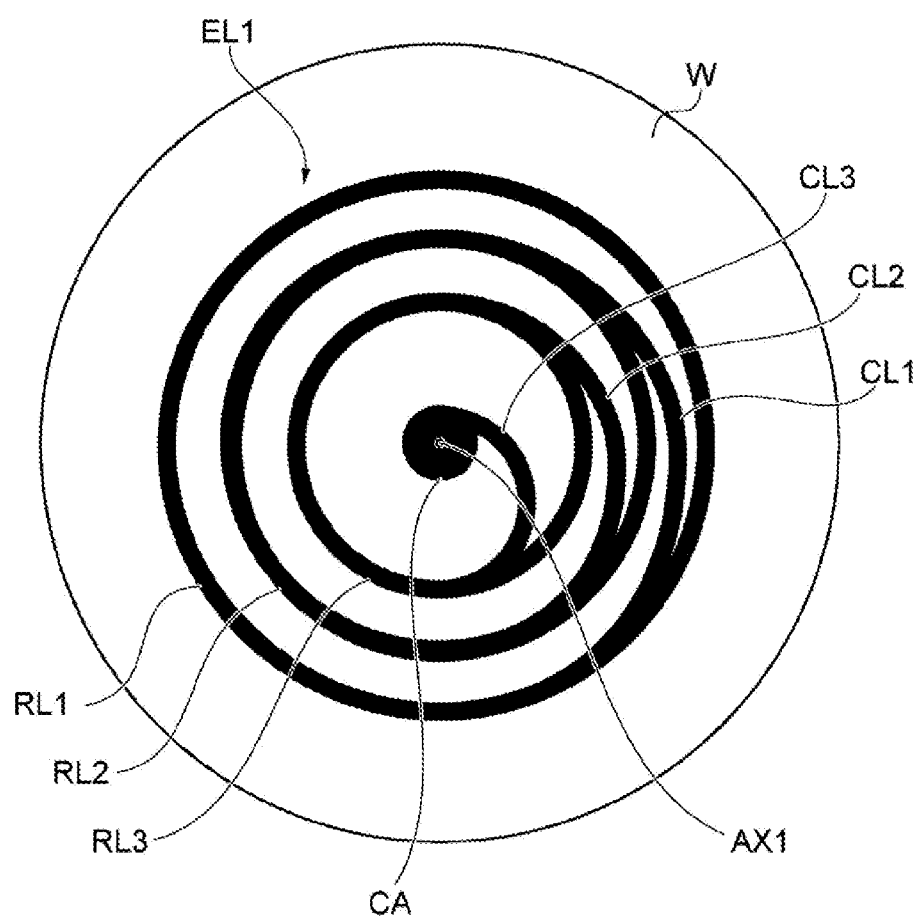
FIG. 9 is a plan view of a wafer in which a resist agent is coated on an encircling line and a central region.

The first coating control block 111 controls the coating liquid supply unit 30 to supply the resist agent onto an encircling line EL1 (see FIG. 9) surrounding the rotational center AX1 of the wafer W while controlling the rotation holding unit 20 to rotate the wafer W. The first coating control block 111 controls the nozzle moving unit 36 to adjust a position of the nozzle 32 and controls the pump 34 and the valve 35 to inject the resist agent through the nozzle 32.

After the resist agent is supplied onto the encircling line EL1, the second coating control block 112 controls the coating liquid supply unit 30 to supply the resist agent onto a central area CA which is positioned inside the encircling line EL1 and includes the rotational center AX1, while controlling the rotation holding unit 20 to rotate the wafer W. The second coating control block 112 controls the nozzle moving unit 36 to adjust the position of the nozzle 32 and controls the pump 34 and the valve 35 to inject the resist agent through the nozzle 32. The second coating control block 112 may not include rotating the wafer W.

After the resist agent is supplied onto both the encircling line EL1 and the central area CA, the third coating control block 113 controls the rotation holding unit 20 to rotate the wafer W at an angular velocity higher than that when the resist agent is supplied onto the encircling line EL1 such that the resist agent applied on the encircling line EL1 and the central area CA widely spreads toward a periphery of the wafer.

<Coating Method>

Figure 6:
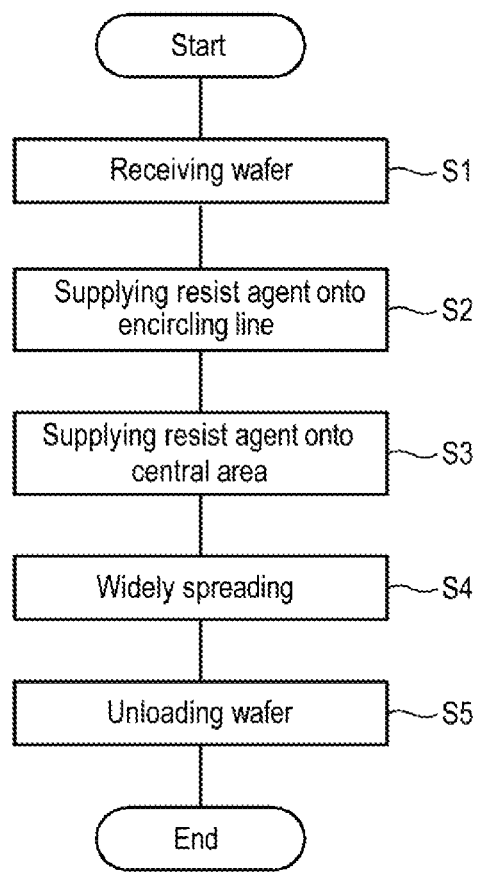
FIG. 6 is a flowchart showing a coating method.

Hereinafter, a coating process executed by the coating unit U1 will be described. As shown in FIG. 6, the coating unit U1 first receives the wafer W (Step S1). The wafer W is loaded into the coating unit U1 by the transfer arm A3 with the surface Wa of the wafer W oriented upward. The holding part 21 supports a central portion of the wafer W from below.

Subsequently, the coating unit U1 supplies the resist agent onto the encircling line EL1 surrounding the rotational center AX1 of the wafer W (Step S2). Specifically, the coating unit U1 is controlled by the first coating control block 111 to operate as follows.

Figure 7A:
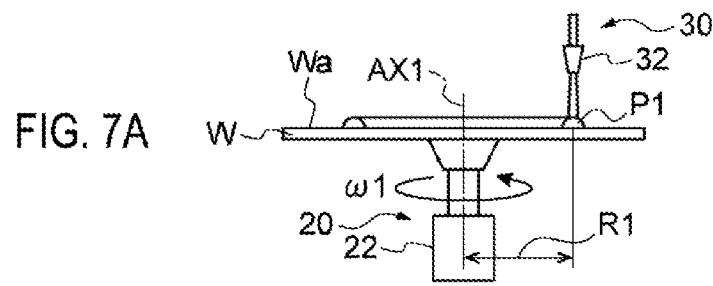
FIGS. 7A to 7E are schematic views showing sequences of supplying a resist agent onto an encircling line.

Specifically, the rotation part 22 rotates the wafer W at the number of revolutions (angular velocity) $\omega_1$ (see FIG. 7A). The number of revolutions $\omega_1$ is, for example, 10 to 120 rpm. In this state, the coating liquid supply unit 30 disposes the nozzle 32 at a position spaced at a distance (or radius) R1 from the rotational center AX1 and injects the resist agent onto the surface Wa of the wafer W through the nozzle 32. Thus, a resist agent P1 is applied along a loop line RL1 having the radius R1 (see FIG. 9). The radius R1 may correspond to, for example, 30 to 70% of a radius of the wafer W.

Figure 7B:
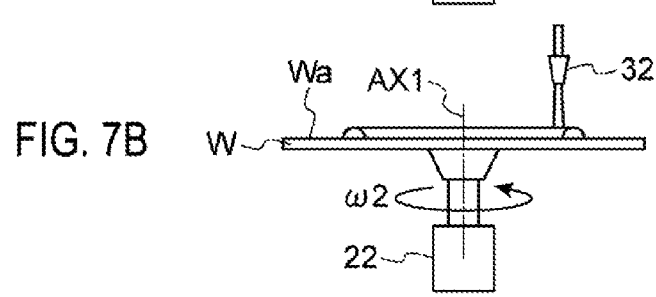

Once the resist agent P1 is applied over the entire circumference of the loop line RL1, the rotation part 22 switches the number of revolutions $\omega_1$ of the wafer W to the number of revolutions $\omega_2$. The number of revolutions $\omega_2$ is greater than the number of revolutions $\omega_1$. The number of revolutions $\omega_2$ may be, e.g., 120 to 200 rpm. In this state, the coating liquid supply unit 30 gradually moves the nozzle 32 toward the rotational center AX1 using the nozzle moving unit 36 while continuously maintaining the injection of the resist agent from the nozzle 32 (see FIG. 7B). This creases a connection line CL1 formed by the resist agent (coating liquid) applied thereon, which gradually approaches the rotational center AX1 while being branched from the middle of the loop line RL1 in the circumferential direction (see FIG. 9).

Figure 7C:
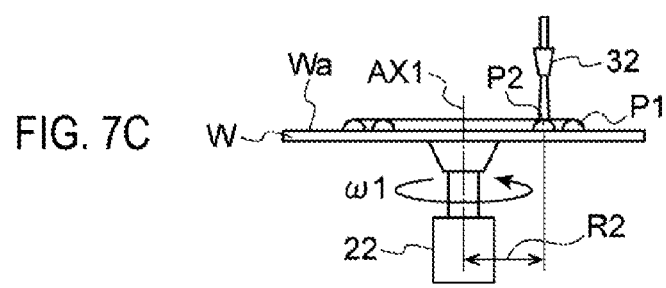

Once the nozzle 32 reaches a position spaced at a distance (or radius) R2 from the rotational center AX1, the nozzle moving unit 36 stops the movement of the nozzle 32. The rotation part 22 switches the number of revolutions $\omega_2$ of the wafer W to the number of revolutions $\omega_1$. The coating liquid supply unit 30 allows the nozzle 32 to continuously inject the resist agent. In this way, a resist agent P2 is applied along a loop line RL2 (see FIG. 9) having the radius R2 (see FIG. 7C). The radius R2 may be, for example, 70 to 80% of the radius R1.

Figure 7D:
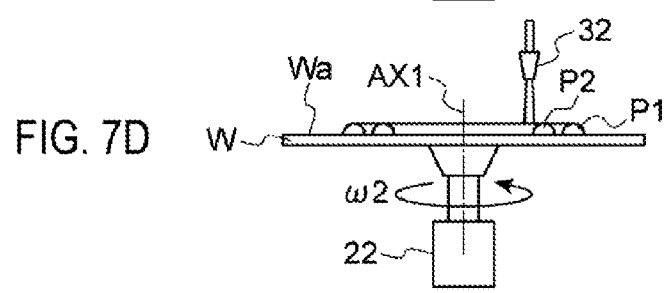

Once the resist agent P2 is applied over the entire circumference of the loop line RL2, the rotation part 22 switches the number of revolutions $\omega_1$ of the wafer W to the number of revolutions $\omega_2$. In this state, the coating liquid supply unit 30 gradually moves the nozzle 32 toward the rotational center AX1 using the nozzle moving unit 36 while continuously maintaining the injection of the resist agent from the nozzle 32 (see FIG. 7D). This creases a connection line CL2 formed by the resist agent (coating liquid) applied thereon, which gradually approaches the rotational center AX1 while being branched from the middle of the loop line RL2 in the circumferential direction (see FIG. 9).

Figure 7E:
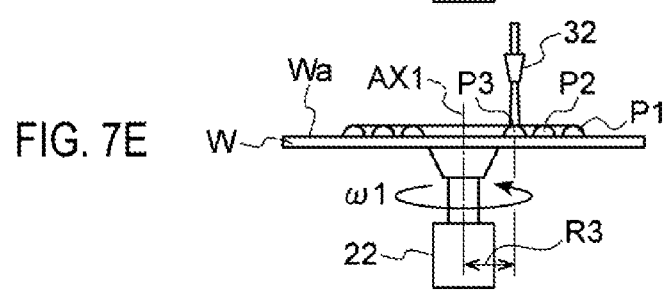

When the nozzle 32 reaches a position spaced at a distance (or radius) R3 from the rotational center AX1, the nozzle moving unit 36 stops the movement of the nozzle 32 (see FIG. 7E). The rotation part 22 switches the number of revolutions $\omega_2$ of the wafer W to the number of revolutions $\omega_1$. The coating liquid supply unit 30 allows the nozzle 32 to continuously inject the resist agent. Thus, a resist agent P3 is applied along a loop line RL3 having the radius R3 (see FIG. 9). The radius R3 may be, for example, 45 to 55% of the radius R1.

Figure 8A:
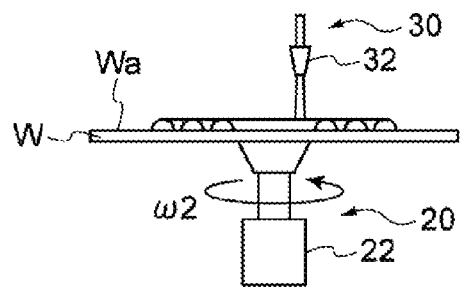
FIGS. 8A to 8C are schematic views showing sequences of supplying a resist agent onto a central region, followed by widely spreading the resist agent by rotation of a wafer.

Once the resist agent P3 is applied over the entire circumference of the loop line RL3, the rotation part 22 switches the number of revolutions $\omega_1$ of the wafer W to the number of revolutions $\omega_2$. In this state, the coating liquid supply unit 30 gradually moves the nozzle 32 toward the rotational center AX1 using the nozzle moving unit 36 while continuously maintaining the injection of the resist agent from the nozzle 32 (see FIG. 8A). This creases a connection line CL3 formed by the resist agent (coating liquid) applied thereon, which gradually approaches the rotational center AX1 while being branched from the middle of the loop line RL3 in the circumferential direction (see FIG. 9).

The combination of the loop lines RL1, RL2 and RL3 and the connection lines CL1, CL2 and CL3 constitute the encircling line EL1. That is, the coating unit U1 supplies the resist agent onto the encircling line EL1 formed by multifold lines.

In some embodiments, the number of revolutions of the wafer W when the resist agent is supplied may be switched on every loop line. As an example, the number of revolutions of the wafer W may be decreased as the radius of a loop line increases. This reduces a centrifugal force acting on the supplied resist agent. Alternatively, the number of revolutions of the wafer W may be increased as the radius of the loop line increases. This reduces a period of time required to supply the resist agent.

Figure 8B:
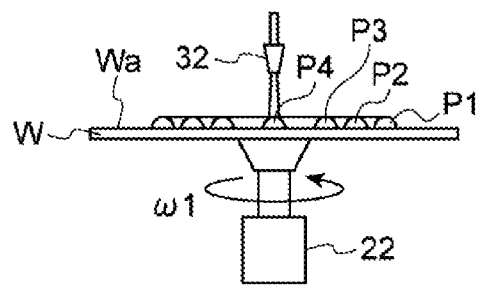

Subsequently, the coating unit U1 supplies the resist agent onto the central area CA which is positioned inside the encircling line EL1 and includes the rotational center AX1 (Step S3). Specifically, the coating unit U1 operates according to the control of the second coating control block 112 as follows. That is, once the nozzle 32 gradually approaching the rotational center AX1 in Step S2 reaches the central area CA, the rotation part 22 switches the number of revolutions $\omega_2$ of the wafer W to the number of revolutions $\omega_1$. The coating liquid supply unit 30 allows the nozzle 32 to continuously inject the resist agent. Thus, a resist agent P4 is applied on the central area CA (see FIG. 8B). In some embodiments, the wafer W may not be rotated when supplying the resist agent onto the central area CA. Upon completion of the supply of the resist agent P4, the coating liquid supply unit 30 stops the injection of the resist agent from the nozzle 32.

Figure 8C:
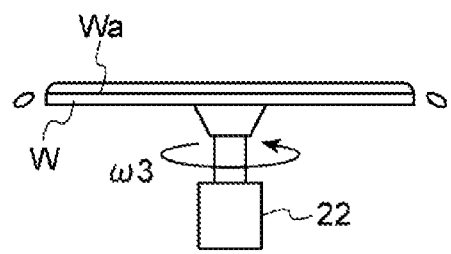

Subsequently, the coating unit U1 widely spreads the resist agent applied on the encircling line EL1 and the central area CA toward the periphery of the wafer W by rotating the wafer W (Step S4). Specifically, the coating unit U1 operates according to the control of the third coating control block 113 as follows. That is, the rotation part 22 switches the number of revolutions $\omega_1$ of the wafer W to a number of revolutions $\omega_3$ (see FIG. 8C). The number of revolutions $\omega_3$ is greater than the number of revolutions $\omega_2$. For example, the number of revolutions $\omega_3$ may be 500 to 1500 rpm.

Figure 10:
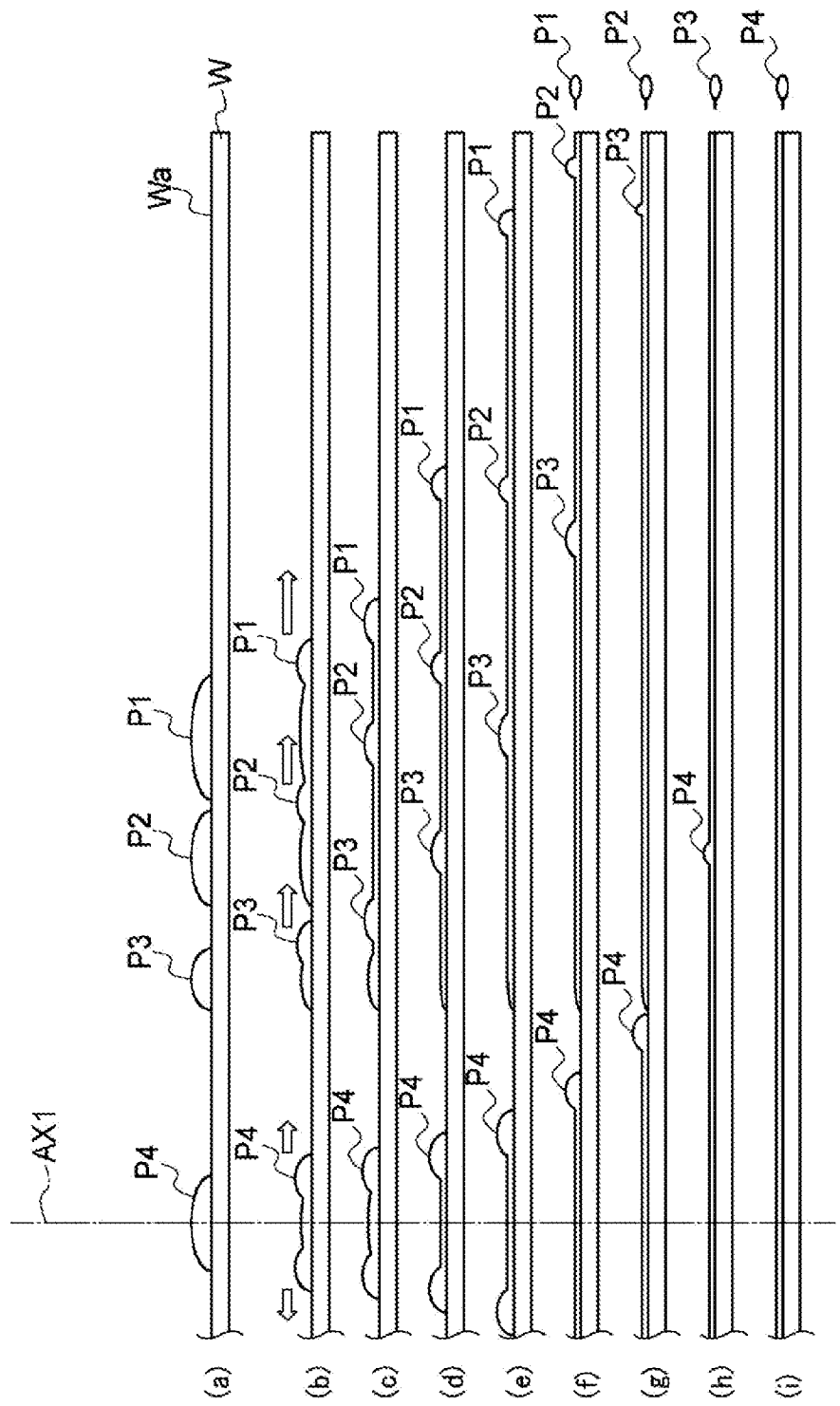
FIG. 10 is a schematic view showing a situation where a resist agent transits along with rotation of a wafer.

By rotating the wafer W at the number of revolutions $\omega_3$, the resist agents P1, P2 and P3 on the encircling line EL1 and the resist agent P4 on the central area CA starts to widely spread toward the periphery of the wafer W (see (b) of FIG. 10). The resist agents P1, P2, P3 and P4 sequentially reach the periphery of the wafer W, so that surpluses of the resist agents P1, P2, P3 and P4 fall off around the periphery of the wafer W (see (c) to (i) of FIG. 10). That is, the resist agent P4 on the central area CA crosses the loop line RL1 (corresponding to the outermost circumference in the encircling line EL1) to widely spread toward the periphery of the wafer W.

Subsequently, the coating unit U1 unloads the wafer W (Step S5) therefrom. The wafer W is unloaded from the coating unit U1 by the transfer arm A3. Before the unloading, the holding part 21 releases holding the wafer W.

As described above, the control unit 100 of the coating unit U1 performs: controlling the coating liquid supply unit 30 to supply the resist agent onto the encircling line EL1 while controlling the rotation holding unit 20 to rotate wafer W; followed by controlling the coating liquid supply unit 30 to supply the resist agent onto the central area CA; followed by controlling the rotation holding unit 20 to rotate the wafer W at the angular velocity greater than that when the resist agent is supplied onto the encircling line EL1 such that the resist agents on the encircling line EL1 and the central area CA widely spread toward the periphery of the wafer W.

According to the coating unit U1, the resist agent is widely spread by the rotation of the wafer W like the conventional spin coating method, thus completing the coating process in a short period of time. However, the conventional spin coating method may cause a film thickness at the periphery of the wafer W to be decreased. The coating unit U1 of the present disclosure supplies the resist agent not only onto the central area CA but also onto the encircling line EL1 surrounding the central area CA, followed by widely spreading the resist agent with the rotation of the wafer W. In addition, the supply of the resist agent onto the encircling line EL1 is followed by the supply of the resist agent onto the central area CA, which makes the resist agent on the encircling line EL1 stay on the wafer for a long period of time as compared with the resist agent on the central area CA. This volatilizes a larger amount of solvent from the encircling line EL1 as compared with that on the central area CA, thus increasing a concentration of the resist agent. With this configuration, when the resist agent widely spreads by the rotation of the wafer W, the outside of the encircling line EL1 is coated with the resist agent at a high concentration as compared with the inside of the encircling line ELL which makes it possible to suppress a decrease in film thickness at the periphery of the wafer W. This improves uniformity of the film thickness while performing the coating process in a short period of time.

The control unit 100 controls the coating liquid supply unit 30 to supply the resist agent onto the encircling line EL1 of which the outermost circumference portion is positioned within a range of 30 to 70% of the radius of the wafer W. This makes it possible to more surely suppress a decrease in film thickness at the periphery of the wafer W.

The control unit 100 controls the coating liquid supply unit 30 to sequentially supply the resist agent onto the innermost circumference portion starting at the outermost circumference portion in the encircling line EL1. Accordingly, if the resist agent is supplied onto the encircling line EL1 and the central area CA, the viscosity of the coating liquid is higher at a position closer to the periphery of the wafer W. When the resist agent widely spreads by the rotation of the wafer W, a concentration of the resist agent is higher at an area closer to the periphery of the wafer W. This further suppresses the film thickness from being decreased at the periphery of the wafer W.

The control unit 100 controls the coating liquid supply unit 30 to supply the resist agent onto the encircling line EL1 formed by the loop lines RL1, RL2 and RL3 and the connection lines CL1 and CL2. As described above, the loop lines RL1, RL2 and RL3 are connected to one another through the connection lines CL1 and CL2 which gradually approach the rotational center AX1 while being branched from the middle of each of the loop lines RL1 and RL2 in the circumferential direction. With this configuration, the resist agent is continuously supplied onto the encircling line EL1 without stopping the supply of the resist agent, thus simplifying the control of the rotation holding unit 20 and the coating liquid supply unit 30.

Further, the control unit 100 controls the coating liquid supply unit 30 to supply the resist agent onto the encircling line EL1 further including the connection line CL3 that connects the loop line RL3 (corresponding to the innermost circumference) and the central area CA. The connection line CL3 gradually approaches the rotational center AX1 while being branched from the middle of the loop line RL3 in the circumferential direction. With this configuration, the resist agent is continuously supplied onto both the encircling line EL1 and the central area CA without stopping the supply of the resist agent, thus further simplifying the control of the rotation holding unit 20 and the coating liquid supply unit 30.

The control unit 100 increases a rotation speed of the wafer W when supplying the resist agent onto the connection lines CL1, CL2 and CL3 as compared with that when supplying the resist agent onto the loop lines RL1, RL2 and RL3. With this configuration, the resist agent is supplied onto the connection lines CL1, CL2 and CL3 which are positioned between the loop lines RL1, RL2 and RL3 and between the loop line RL3 and the central area CA, and are widely extended in the circumferential direction. This reduces a difference in supply amount of the resist agent in the circumferential direction, thus further improving the uniformity of film thickness.

The control unit 100 controls the rotation holding unit 20 such that the resist agent on the central area CA crosses the loop line RL1 (corresponding to the outermost circumference in the encircling line EL1) to widely spread toward the periphery of the wafer W. Accordingly, the outer area of the encircling line EL1 is coated with both the coating liquid on the central area CA and the coating liquid on the encircling line EL1. This makes it possible to more surely suppress a decrease in film thickness at the periphery of the wafer W.

When a resist agent of a high viscosity is used, the effects described above become further remarkable as compared with a resist agent of a common viscosity. The common viscosity is, for example, 100 cP or less. High viscosity means a viscosity of, e.g., 500 to 5000 cP. In addition, when a wafer having a large diameter (e.g., 450 mm) is used, the effects described above become further remarkable.

Figure 11:
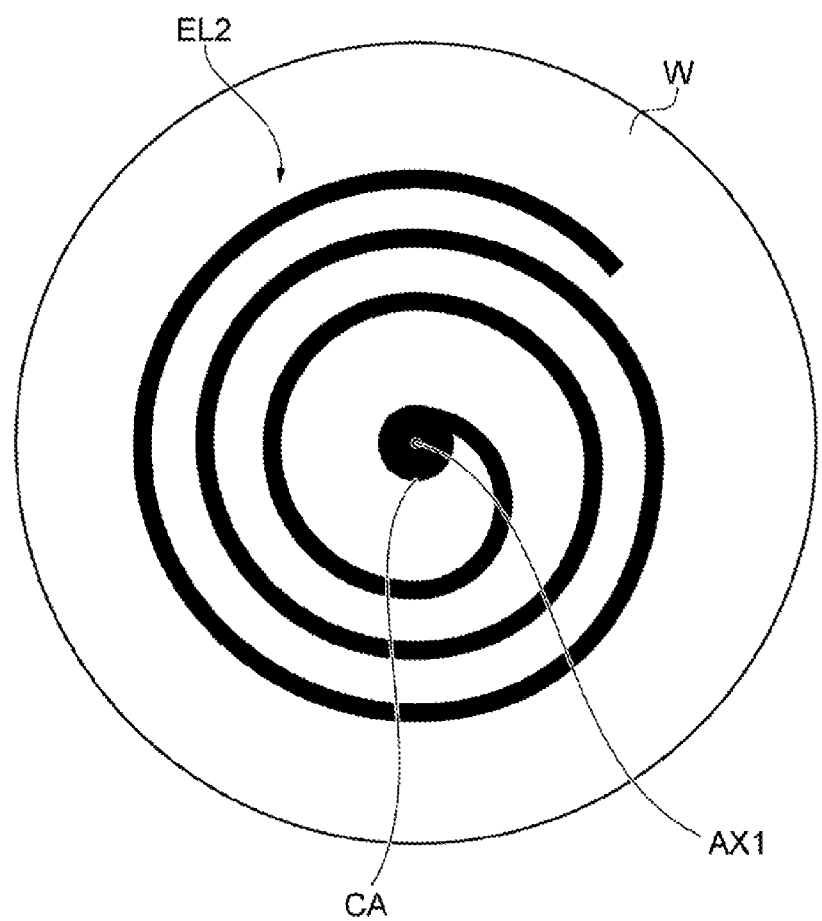
FIG. 11 is a plan view of another example of a wafer having a resist agent coated on an encircling line and a central region.

While the present disclosure has described exemplary embodiments, the present disclosure is not limited thereto, but may be modified in a variety of forms without departing from the spirit and scope of the disclosure. As an example, the resist agent may not be supplied onto the connection lines CL1, CL2 and CL3. In some embodiments, the control unit 100 may control the coating liquid supply unit 30 to supply the resist agent onto another encircling line EL2 formed to have a spiral pattern (see FIG. 11). This configuration allows the resist agent to be supplied onto the encircling line EL2 without stopping the supply of the resist agent, thus simplifying the control of the rotation holding unit 20 and the coating liquid supply unit 30. Alternatively, the control unit 100 may control the coating liquid supply unit 30 to supply the resist agent onto an encircling line formed in one-fold line. The substrate to be processed is not limited to a semiconductor wafer and may be, for example, a printed circuit board.

EXAMPLES

Experiments have been Performed to Monitor States of Film Thickness Using Samples according to an example of the above embodiment and a comparative example. In addition, the present disclosure is not limited to the Example.

Example

A wafer W having a diameter of 450 mm was prepared, and a resist film was formed under the following conditions. A resist agent having a viscosity of about 4000 cP as a coating liquid was sequentially supplied onto loop lines RL1, RL2 and RL3 and a central area CA. Subsequently, the wafer W was rotated to widely spread the resist agent. Thereafter, the resist agent was hardened to form a resist film. Radiuses of the loop lines RL1, RL2 and RL3 were set to 100 mm, 75 mm and 50 mm, respectively. Supply amounts of the resist agent onto the loop lines RL1, RL2, RL3 and the central area CA were 7.5 g, 5 g, 7.5 g and 10 g, respectively. The number of revolutions (angular velocity) when the resist agent widely spread was set to 600 rpm, and a period of rotation duration time was set to 60 sec.

Comparative Example

A wafer W having a diameter of 450 mm was prepared, and a resist film was formed under the following conditions. A resist agent having a viscosity of about 4000 cP as a coating liquid was supplied onto only the central area CA about 30 g. Subsequently, the wafer W was rotated to widely spread the resist agent. Thereafter, the resist agent was hardened to form a resist film. The number of revolutions (angular velocity) when the resist agent widely spread was set to 600 rpm, and a period of rotation duration time was set to 60 sec.
<Comparison Result>

Calculation has been performed to compare a variation (corresponding to three times greater than the standard deviation) in film thickness for each of the samples of the present example and the comparative Example. The comparison result show that the variation in film thickness in the sample of the comparative Example was 5.9% with respect to an average film thickness. The variation in film thickness in the sample of the present example was 3.9% with respect to the average film thickness. From these results, the above embodiment of the present disclosure shows that the uniformity of film thickness is improved.

According to the present disclosure in some embodiments, it is possible to improve uniformity of film thickness while performing a coating process in a short period of time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating method for use in a coating apparatus, the method comprising:
    supplying a coating liquid onto an encircling line surrounding a rotational center of a substrate while rotating the substrate;
    supplying the coating liquid onto a central area, which is positioned inside the encircling line and includes the rotational center of the substrate; and
    rotating the substrate at an angular velocity greater than that when supplying the coating liquid onto the encircling line such that the coating liquid on the encircling line and the central area widely spreads toward a periphery of the substrate,
    wherein the coating liquid is supplied onto the encircling line which is formed by multifold lines, and
    wherein the coating liquid is supplied onto the encircling line which includes a plurality of loop lines and connection lines connecting between the loop lines, the connection lines gradually approaching the rotational center while being branched from the middle of each of the loop lines in a circumferential direction.

2. The method of claim 1, wherein the coating liquid is supplied onto the encircling line of which the outermost circumference portion is positioned within a range of 30 to 70% of a radius of the substrate.

3. The method of claim 1, wherein, in supplying the coating liquid onto the connection lines, the substrate is rotated at an angular velocity higher than that when supplying the coating liquid onto the loop lines.

4. The method of claim 1, wherein the coating liquid on the central area crosses the outermost circumference portion in the encircling line to widely spread toward the periphery of the substrate.

5. A non-transitory computer-readable storage medium storing a program operating on a computer stored thereon, wherein the program, when executed, causes the computer to perform the coating method of claim 1 using a coating apparatus.

* * * * *